United States Patent
Leenaerts et al.

(10) Patent No.: US 8,805,309 B2
(45) Date of Patent: Aug. 12, 2014

(54) DOWN-CONVERTER

(75) Inventors: Dominicus Martinus Wilhelmus Leenaerts, Riethoven (NL); Gerben Willem De Jong, Veldhoven (NL); Edwin Van Der Heijden, Eindhoven (NL); Marcellinus Johannes Maria Geurts, Nijmegen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/558,131

(22) Filed: Jul. 25, 2012

(65) Prior Publication Data

US 2013/0028352 A1 Jan. 31, 2013

(30) Foreign Application Priority Data

Jul. 28, 2011 (EP) .................................. 11250679

(51) Int. Cl.
*H04B 7/08* (2006.01)
*H04B 1/26* (2006.01)
*H03D 7/16* (2006.01)
*H04B 1/00* (2006.01)
*H04B 7/04* (2006.01)

(52) U.S. Cl.
CPC .............. *H03D 7/163* (2013.01); *H04B 1/0082* (2013.01); *H04B 7/0469* (2013.01)
USPC ........... 455/132; 455/141; 455/318; 455/323; 455/273

(58) Field of Classification Search
CPC ......... H03D 7/16; H03D 7/163; H03D 7/167; H04B 1/0082; H04B 7/02; H04B 7/04; H04B 7/0469; H04B 7/0817
USPC .............. 455/552.1, 553.1, 132, 76, 318, 323
See application file for complete search history.

(56) References Cited

U.S. PATENT DOCUMENTS

| | | | |
|---|---|---|---|
| 4,580,289 A | | 4/1986 | Enderby |
| 5,752,180 A | * | 5/1998 | Guo et al. ..................... 455/319 |
| 6,088,348 A | * | 7/2000 | Bell et al. ..................... 370/343 |
| 7,035,613 B2 | * | 4/2006 | Dubash et al. ................ 455/302 |
| 7,092,676 B2 | * | 8/2006 | Abdelgany et al. ............ 455/76 |
| 7,277,679 B1 | * | 10/2007 | Barratt et al. ................. 455/101 |
| 7,277,727 B1 | * | 10/2007 | Rausch et al. ................ 455/561 |

(Continued)

FOREIGN PATENT DOCUMENTS

| | | |
|---|---|---|
| EP | 1096667 A1 | 5/2001 |
| EP | 1696581 A1 | 8/2006 |

OTHER PUBLICATIONS

European Search Report, 11250679.5, Dec. 5, 2011.

*Primary Examiner* — Duc M Nguyen

(57) ABSTRACT

A down-converter for receiving a multiband radio frequency signal (RF) and a local oscillator signal comprises a frequency divider and a heterodyne receive chain. The frequency divider is configured to divide the local oscillator signal and provide different divided local oscillator signals. The heterodyne receive chain comprises a first stage mixer and second stage mixers. The first stage mixer is configured to mix the multiband radio frequency signal and either the local oscillator signal or a divided local oscillator signal to generate a first intermediate frequency signal. Each second stage mixer is configured to mix the first intermediate signal and a divided local oscillator signal to generate second intermediate frequency signals that each represent a band from the multiband radio frequency signal. The frequency divider is configured to provide a different divided local oscillator signal to each of the second stage mixers.

13 Claims, 9 Drawing Sheets

(56) References Cited

U.S. PATENT DOCUMENTS

| | | | |
|---|---|---|---|
| 7,519,348 B2* | 4/2009 | Shah | 455/285 |
| 7,551,127 B2* | 6/2009 | Dubash et al. | 342/357.72 |
| 7,598,815 B2* | 10/2009 | Chen et al. | 331/16 |
| 7,937,052 B2* | 5/2011 | Banh et al. | 455/140 |
| 7,970,372 B2* | 6/2011 | Watanabe | 455/314 |
| 8,086,170 B2* | 12/2011 | Petrovic et al. | 455/3.02 |
| 8,532,601 B2* | 9/2013 | Tuttle et al. | 455/333 |
| 8,553,804 B2* | 10/2013 | Siwiak et al. | 375/299 |
| 2004/0142723 A1* | 7/2004 | Shippee | 455/552.1 |
| 2004/0259518 A1* | 12/2004 | Aktas et al. | 455/323 |
| 2006/0094374 A1* | 5/2006 | Olip | 455/76 |
| 2006/0176215 A1* | 8/2006 | Dubash et al. | 342/357.06 |
| 2010/0210272 A1* | 8/2010 | Sundstrom et al. | 455/450 |
| 2010/0261500 A1* | 10/2010 | Karaoguz et al. | 455/552.1 |
| 2011/0136455 A1* | 6/2011 | Sundstrom et al. | 455/196.1 |
| 2011/0268163 A1* | 11/2011 | Fillatre et al. | 375/219 |

* cited by examiner

DOWN-CONVERTER

CROSS-REFERENCE TO RELATED APPLICATIONS

This application claims the priority under 35 U.S.C. §119 of European patent application no. 11250679.5, filed on Jul. 28, 2011, the contents of which are incorporated by reference herein.

The present disclosure relates to the field of down-converters, and in particular, although not exclusively, to down-converters for down-converting a multiband radio frequency signal using a local oscillator signal.

In prior art multi-channel receiver devices, such as satellite television receivers, each down-conversion process requires a single dielectric resonant oscillator (DRO) to act as a local oscillator. This means that for the Ka-band, which has 3 band groups, 3 DROs are needed. Similarly 2 DROs are required for the down-conversion of Ku-band. Hence a combined Ka- and Ku-band converter needs 5 separate DROs. These DROs generate beat frequencies at differences of their central frequencies. These beat frequencies, or their harmonics, can fall inside the intermediate frequency (IF) band and can cause spurious imperfections. Also, in prior art solutions the image frequency band can be close to the wanted frequency band due to the down-conversion scheme. This means that a high order of filtering can be required. In order to avoid interference issues, prior art solutions tend to be constructed from discrete components.

An aspect of the present invention relates to a down-converter for receiving a multiband radio frequency signal and a local oscillator signal, the down-converter comprising:

a frequency divider configured to divide the local oscillator signal and provide a plurality of different divided local oscillator signals; and a heterodyne receive chain comprising:

a first stage mixer configured to mix the multiband radio frequency signal and either the local oscillator signal or a divided local oscillator signal in order to generate a first intermediate frequency signal, a plurality of second stage mixers, each second stage mixer configured to mix the first intermediate signal and a divided local oscillator signal in order to generate second intermediate frequency signals that each represent a band from the multiband radio frequency signal;

wherein the frequency divider is configured to provide a different divided local oscillator signal to each of the second stage mixers.

The division of the local oscillator signal to provide a plurality of oscillator signals, one for each mixer, can be an efficient method of generating signals that can be used for down-converting the received radio frequency signal into signals representative of different bands. This can reduce the need for additional bulky and expensive local oscillator components required in prior art implementations.

Providing each of the local oscillators signals at a different frequency allows interference between frequency bands to be reduced or minimised. The reduction in interference afforded by this design can enable a multi-band down-converter to be implemented on a single integrated circuit, rather than as a plurality of discrete components.

Each of the second intermediate frequency signals may comprise frequencies within the L-band. The L-band can be a frequency band between about 0.95 and about 2.15 GHz.

The down-converter may further comprise a plurality of heterodyne receive chains. Each of the heterodyne receive chains may be configured to receive the same plurality of different divided local oscillator signals. The separate heterodyne receive chains can, for example, separately process horizontally, vertically, left-hand or right-hand polarised signals. As each of the receive chains in such an embodiment shares a frequency divider, and receives the same local oscillator signal, the duplication of local oscillator components can be eliminated.

The frequency divider may provide a different divided local oscillator signals to each mixer. Alternatively, the divider can provide the same set of divided local oscillator signals to a plurality of different heterodyne receive chains. The provision of multiple heterodyne receive chains may be advantageous in applications where a band contains orthogonally polarised signals, for example horizontally and vertically polarised signals. In such as situation, providing the same divided local oscillator signals to multiple heterodyne receive chains can allow a simplification of the design of the divider.

The frequency of the local oscillator signal may be an integer multiple of the frequency of the divided local oscillator signal. If the local oscillator signal frequency is an integer multiple of the divided local oscillator signal frequency, that is, the divided local oscillator signal is generated by dividing the local oscillator signal by an integer, then beat interference between the different mixers can be reduced or eliminated.

The frequency of the local oscillator signal may be equal to a divided local oscillator signal frequency multiplied by two to the power of an integer ($2^n$). This can allow binary counting circuits to be used for producing the various frequency division signals. This may represent a significant simplification of circuit design.

The down-converter may further comprise one or more filters coupled between the first stage mixer and one or more of the second stage mixers. The filters may be band pass filters. The filters may be configured to block signals with a frequency that does not correspond to the band of the first intermediate frequency signal.

The down-converter may further comprise a filter coupled between an input of the radio circuit for receiving the radio frequency signal and an input of the first stage mixer configured to receive the radio frequency signal. The filter may be configured to block signals with a frequency that does not correspond to the bands of the radio frequency signal.

The down-converter may further comprise one or more filters configured to filter one or more of the second intermediate frequency output signals in order to block signals with a frequency that does not correspond to the band of the associated second intermediate frequency signal. The filter may be a band pass filter.

Any of the filters within the down-converter may be a poly phase filter.

The down-converter may further comprise an amplifier configured to amplify the radio frequency signal and provide it to the first stage mixer.

The local oscillator signal frequency may be a fixed frequency signal. Embodiments of the present invention may be configured such that the local oscillator signal frequency is fixed, unlike prior art super-heterodyne receivers in which the local oscillator frequency is varied depending upon the desired frequency band. In some applications, a multi-channel receiver may be required to be constantly tuned in to a number of fixed frequencies. Examples of such situations are common in mobile telecommunications base stations. In such cases, the present invention may provide a solution in which a number of bands can be received simultaneously using a single fixed frequency local oscillator.

Each divided local oscillator signal may be of a fixed frequency. Although in some applications the frequency divider may be configured to provide variable divided local oscillator frequencies, for applications with fixed channel requirements the implementation of the divider can be simplified by providing fixed frequency divided oscillator signals to the various mixers.

A further aspect of the invention relates to a radio circuit comprising any down-converter disclosed herein and a local oscillator signal generator.

A further aspect of the invention relates to a method for down-converting a radio frequency signal into a plurality of intermediate frequency signals, the method comprising:

receiving a multiband radio frequency signal and a local oscillator signal;

mixing a signal derived from the radio frequency signal with a signal derived from the local oscillator signal in order to obtain a first intermediate frequency signal;

dividing the frequency of a signal derived from the local oscillator signal by a first factor in order to obtain a first divided local oscillator signal;

mixing the first intermediate frequency signal with the first divided local oscillator signal in order to obtain a first output intermediate frequency signal;

dividing the frequency of a signal derived from the local oscillator signal by a second factor in order to obtain a second divided local oscillator signal, wherein the second factor is different to the first factor; and mixing the first intermediate frequency signal with the second divided local oscillator signal in order to obtain a second output intermediate frequency signal, wherein the first and second output intermediate frequency signals represent bands from the multiband radio frequency signal.

The invention is described in more detail below by way of illustrative exemplary embodiments, with reference to the accompanying drawings in which.

Figure 4:
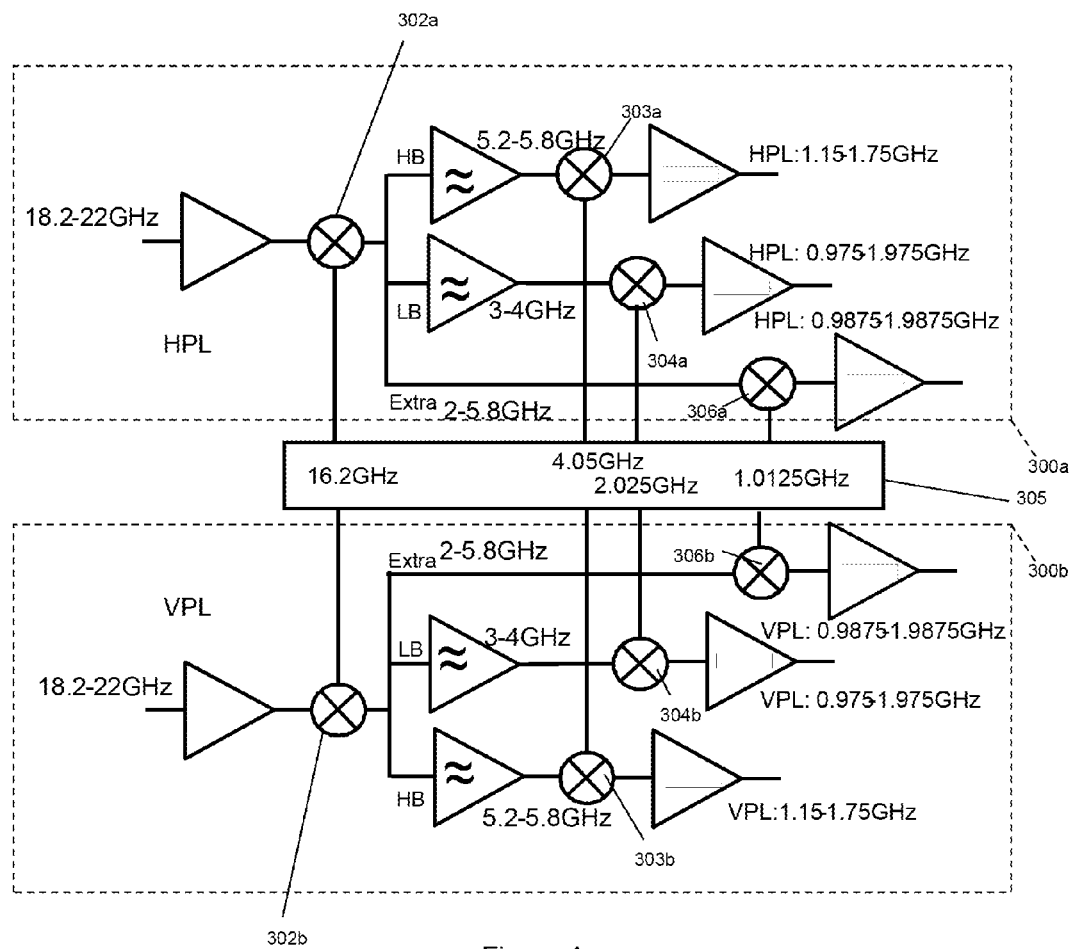
FIG. 4 illustrates an embodiment in accordance with the present invention, showing details of example operating frequencies for a Ka-band system.
Figure 5A:
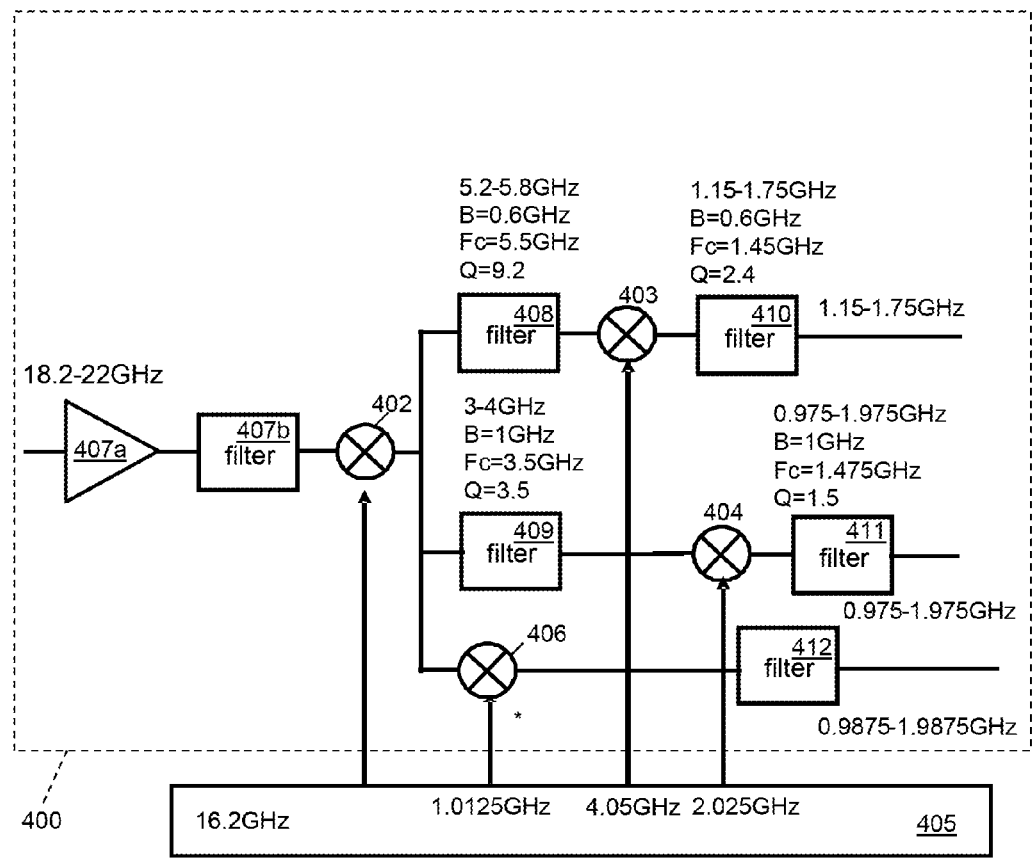
Figure 5B:
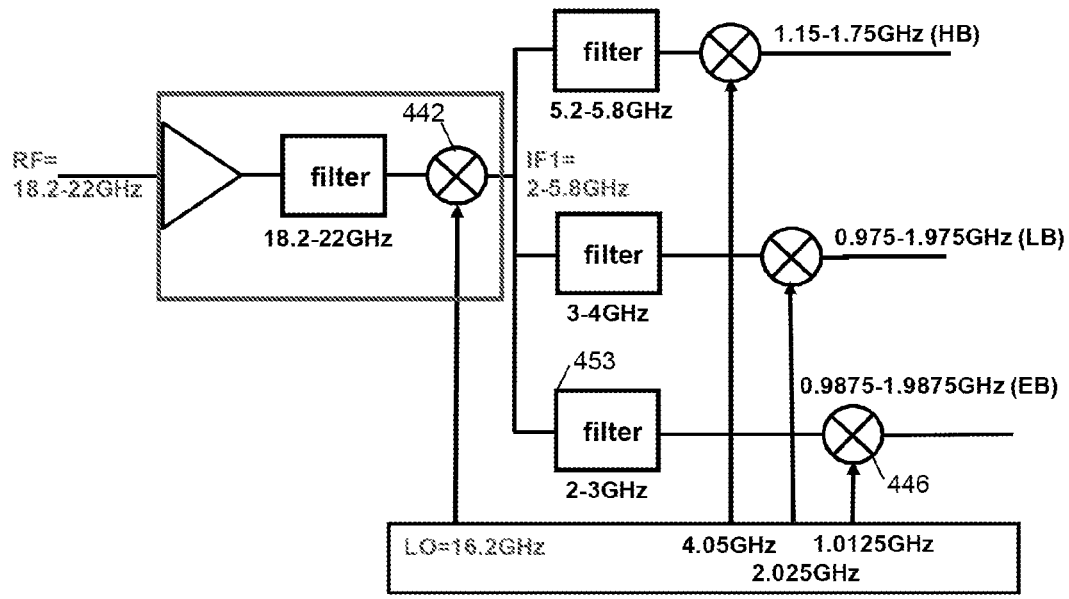
Figure 5C:
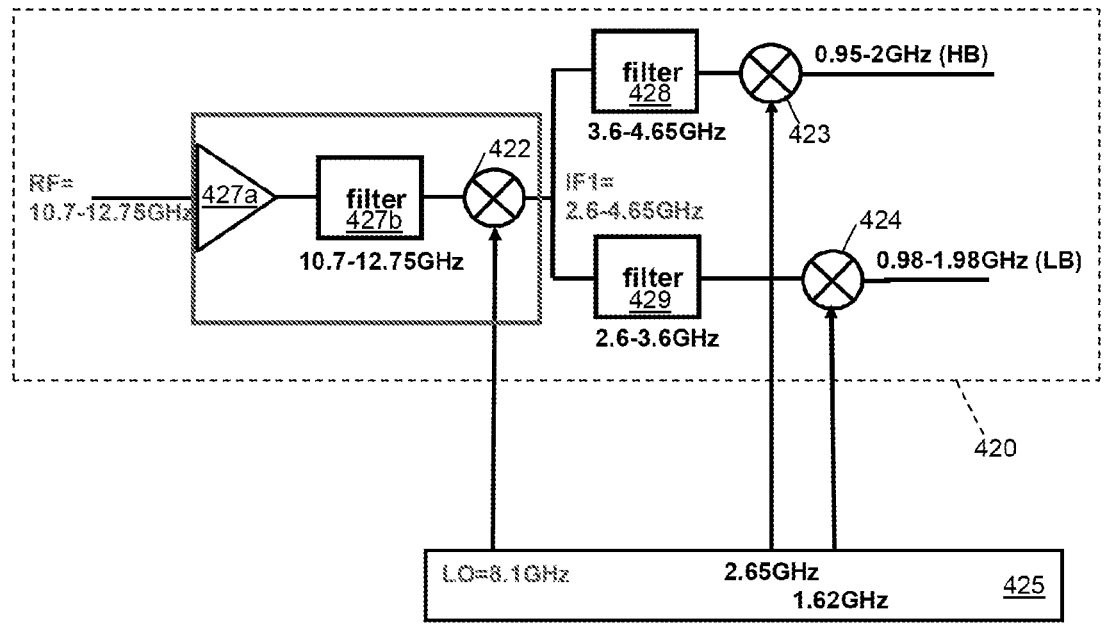
Figure 6:
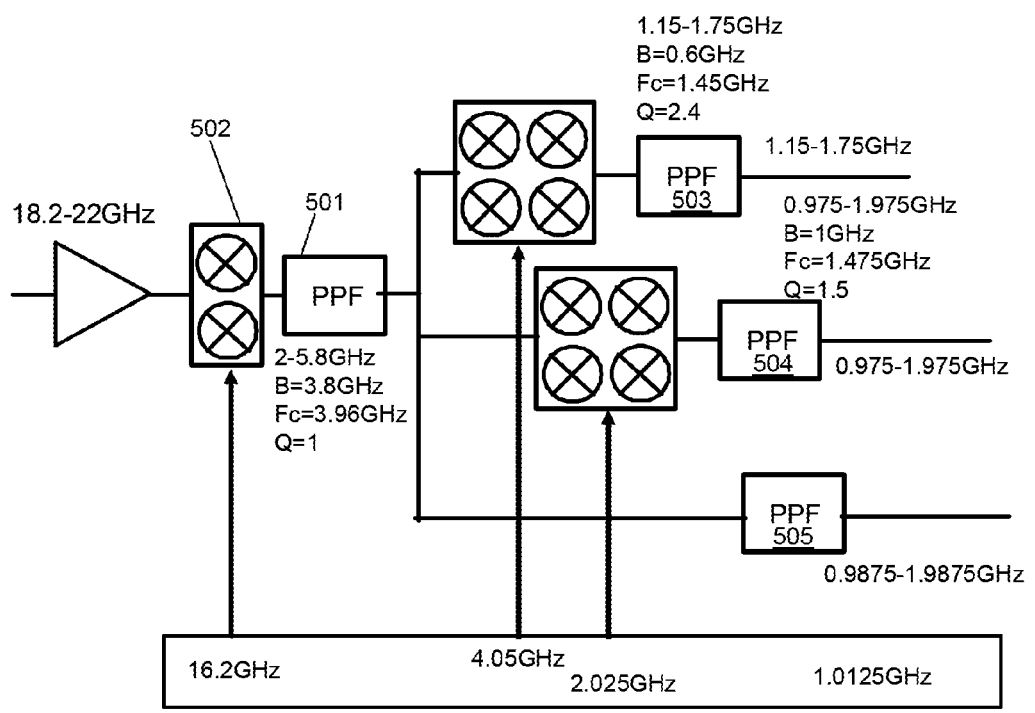
Figure 7:
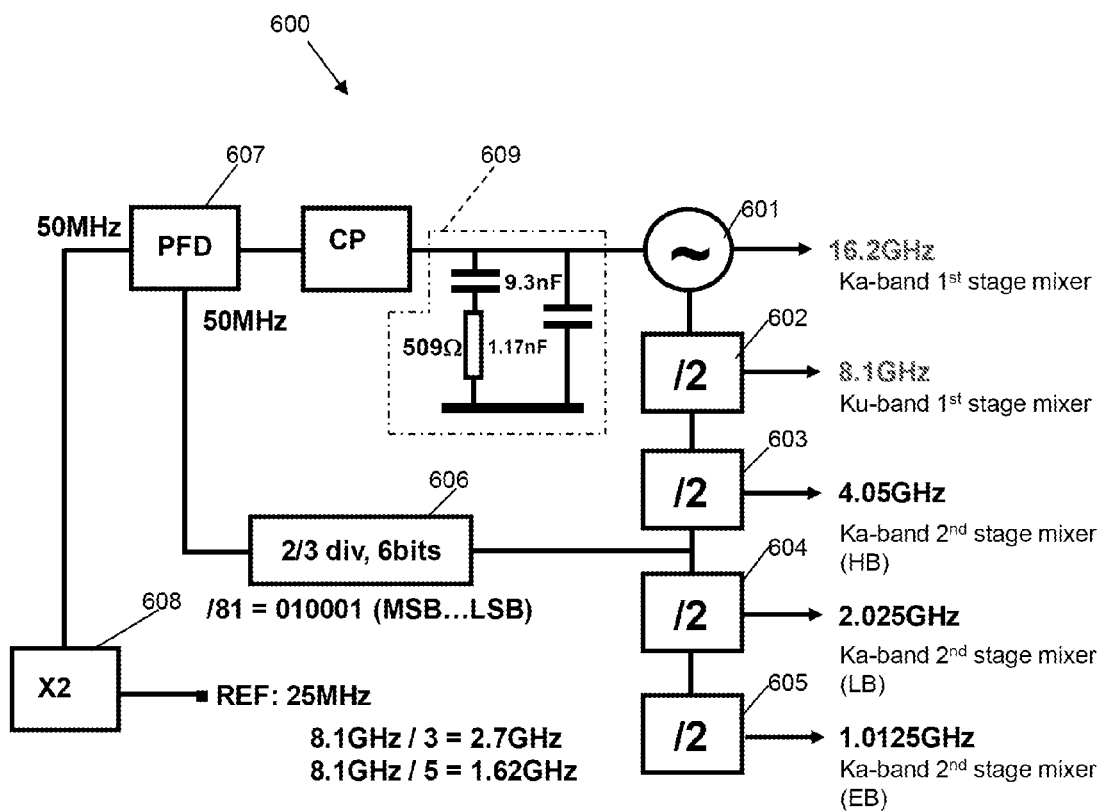

FIGS. 5a, 5b and 5c further illustrate the embodiment of FIG. 4, showing details of example operating frequencies for a Ka-band (FIGS. 5a and 5b) as well as for a Ku-band (FIG. 5c) system;

FIG. 6 shows a functional diagram for a frequency divider for use with the present invention; and FIG. 7 shows an embodiment of the present invention implemented using poly-phase filtering.

One or more embodiments of the invention disclosed herein enable integration of a system which simultaneously performs down-conversion at multiple frequency bands. Embodiments of the invention can utilise two-stage heterodyne frequency conversion. The first stage of the frequency conversion down-converts an input signal to an intermediate frequency (IF) band. The intermediate frequency band is subsequently down-converted to a plurality of other frequency bands in parallel. The local oscillator signals provided to the various mixers can be all derived from a single local oscillator signal using a frequency divider. Various embodiments of the invention use extensive (poly) phase filtering to remove the image and/or attenuation of adjacent frequency bands. Heterodyne mixing realizes relaxed frequency spacing at IF, which can enable filtering with lower order filters. Lower order filtering can be advantageous as these filters can be less complex, can filter at lower frequencies, and can be less sensitive to component spread etc.

Some embodiments can be applicable to the Satellite Low Noise Block converters (LNB) market. This architecture plan may be applicable as a replacement for the current TFF1014 LNB down-converter that is used in Ka-band applications.

Known down-converters, whether operating in the Ka- or Ku-band, make use of discrete Dielectric Resonator Oscillators (DRGs) allowing them to perform direct down-conversion from the Ka- and/or Ku-band to an intermediate frequency (IF) band between 950 MHz and 2.15 GHz.

The satellite Ka-band contains 3 sub-bands: the Extra Band (EB: 18.2-19.2 GHz), the Low Band (LB: 19.2-20.2 GHz) and the High Band (HB: 21.4-22 GHz). These three sub-bands are transmitted in two polarizations; left and right.

The satellite Ku-band contains two sub-bands: the Low Band (LB: 10.7-11.7 GHz) and the High Band (HB: 11.7-12.75 GHz). These two sub-bands are transmitted in two polarizations; horizontal and vertical.

Figure 1A:
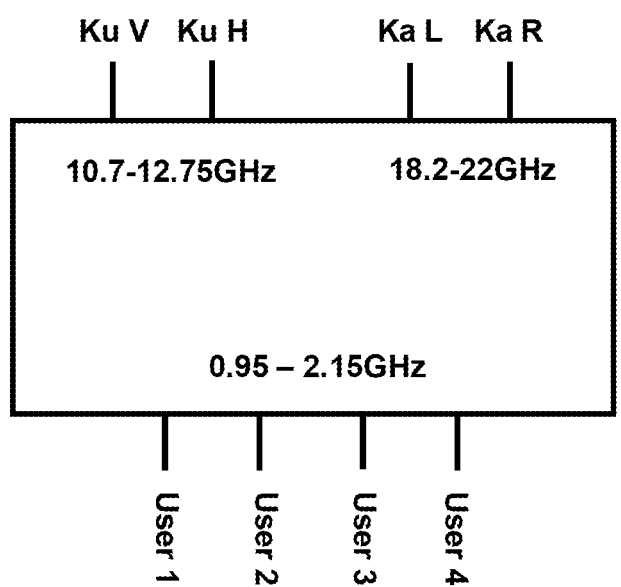
FIGS. 1a and 1b show functional diagrams of a prior art down-converter operating in the Ku- and Ka-bands.

A universal Quad Low-Noise-Block-down-converter (LNB) is shown in FIG. 1a. This LNB down-converts the 3 frequency sub-bands in the Ka-band and the 2 sub-bands in the Ku-band towards a second intermediate frequency band, also known as the L-band (which has a bandwidth of 0.95-2.15 GHz) for each polarisation (horizontal and vertical for the Ku-band, and left and right for the Ka-band).

The quad LNB shown in FIG. 1a can handle up to 4 users, and can enable each user to independently and simultaneously select one sub-band out of all received sub-bands. Channel selection can take place using a television set top box (STB), for example.

Figure 1B:
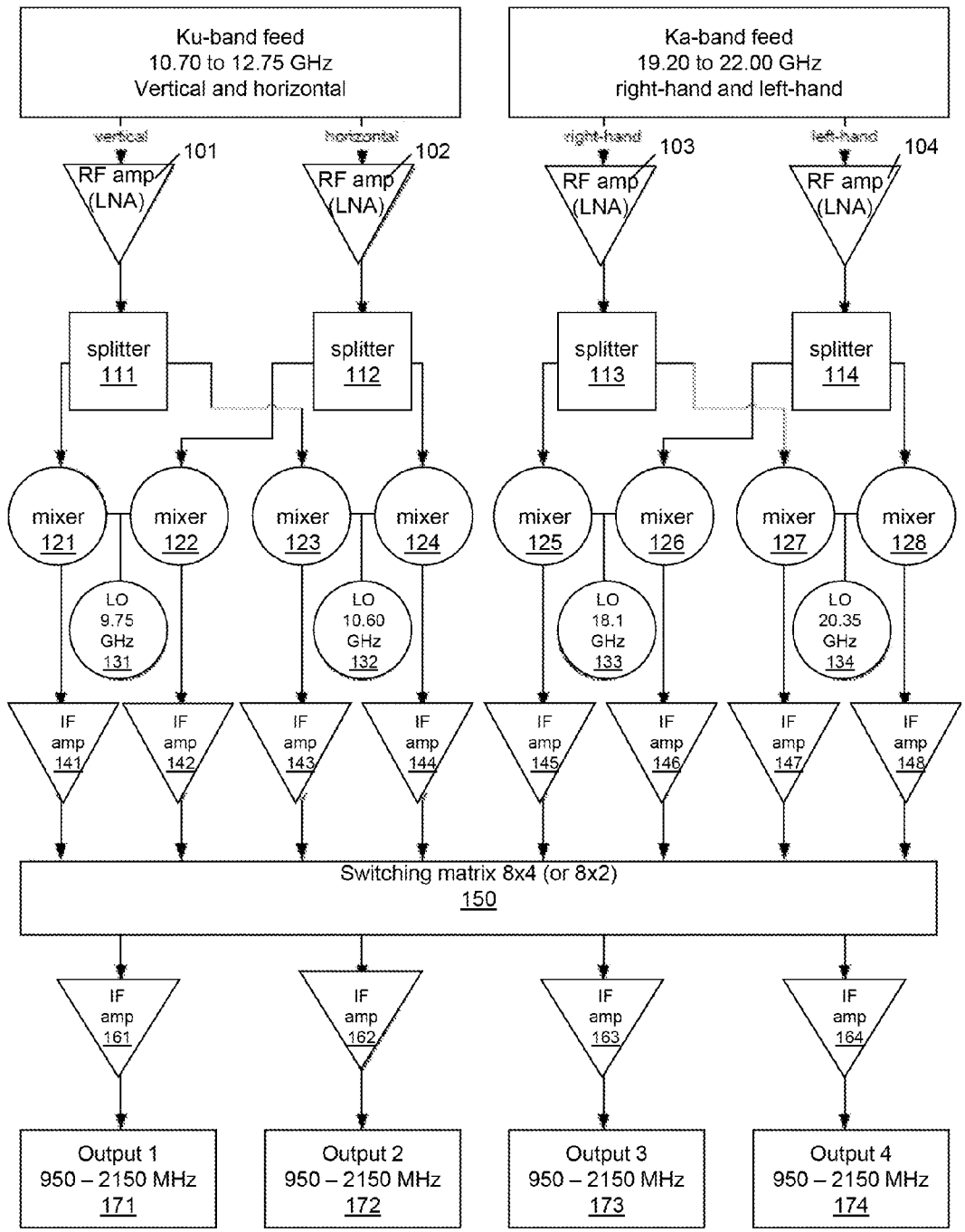

A block diagram of a state-of-the-art down-converter is shown in FIG. 1b. This down-converter fulfils the functionality of the quad LNB shown in FIG. 1a.

Typically noise levels in state-of-the-art solutions are in the sub-dB range. It is common for a first amplification to be performed by low noise amplifiers (LNAs) realized in compound semiconductor technologies, i.e. pHEMT GaAs.

The traditional, as well as the state-of-the-art, architecture uses 5 local oscillators (LO) to perform direct down-conversion. For the Ku-band, the LO generators operate at 9.75 GHz (LB) and 10.60 GHz (HB). For the Ka-band, these operating frequencies are 17.1 GHz (EB), 18.1 GHz (LB), and 20.35 GHz (HB).

The block diagram of FIG. 1b illustrates the conversion of vertically (v) and horizontally (h) polarised Ku-band signals at frequencies between 10.70 and 12.75 GHz and right-hand (r) and left-hand (l) polarised Ka-band signals at frequencies between 19.20 and 22.00 GHz to four different output channels 171, 172, 173, 174. Each output channel 171, 172, 173, 174 has the same nominal output bandwidth (between 950 and 2150 MHz).

The down-conversion process illustrated in FIG. 1b is a multi-step process. First the v-Ku, h-Ku, r-Ka and l-Ka signals are separately fed into respective low noise amplifiers 101, 102, 103, 104 operating at radio frequencies. The output of each of the low noise amplifiers 101, 102, 103, 104 is fed to one of four signal splitters 111, 112, 113, 114. Each signal splitter 111, 112, 113, 114 has two output signals.

Eight mixers 121-128 are required for the next stage in the process. Four mixers 121-124 are provided for the Ku-band, and four mixers 125-128 for the Ka-band. The mixers 121-128 are arranged in pairs. Each pair of mixers 121-128 receives a signal from one of four local oscillators 131-134. The local oscillators 131-134 shown in FIG. 1b generate signals at 9.75 GHz 131 and 10.60 GHz 132 for the Ku-band mixers 121-124, and 18.1 GHz 133 and 20.35 GHz 134 for the Ka-band mixers 125-128.

The two pairs of mixers 121-122, 123-124 in the Ku-band path each have a mixer 121, 123 receiving a signal from the v-Ku signal splitter 111 and a mixer 122, 124 receiving a signal from the h-Ku signal splitter 112. Similarly, the two pairs of mixers 125-126, 127-128 in the Ka-band path each have a mixer 125, 127 receiving a signal from the r-Ka signal splitter 113 and a mixer 126, 128 receiving a signal from the l-Ka signal splitter 114.

The eight mixers 121-128 provide their respective outputs to eight respective intermediate frequency (IF) amplifiers 141-148. The eight IF amplifiers 141-148 feed the amplified signals to a switching matrix (8×4) 150. The switching matrix 150 ensures that any of the four output channels 171-174 can receive any of the input RF signals (v-Ku, h-Ku, r-Ka or l-Ka) independently of the other output channels 171-174. Another IF amplifier stage 161-164 is provided between the switching matrix 150 and each of the output channels 171-174.

A significant problem with the frequency plan used by the prior art solutions in FIG. 1b is the generation of beat frequencies. For instance, the local oscillator signals of 9.75 GHz and 10.60 GHz result in a beat frequency of 850 MHz, for which the second harmonic is 1.7 GHz. This spurious tone falls directly in the IF band. The same is true for the beat frequency of 1 GHz. Moreover, the 20.35 GHz LO is close to the second harmonic of the 10.60 GHz LO 132, which might result in pulling effects. Pulling effects occur when oscillators are located close to each other on the same die. In which case, one of the LO sources can disturb the other oscillator causing the resonant frequency of the other oscillator to shift.

Embodiments of the present invention can provide a system and frequency plan where all of the LO frequencies required by the system can be derived from a single oscillator frequency. The use of a single phase-locked loop (PLL) is possible when an heterodyne down-conversion architecture is chosen. In one example, the local oscillator can be chosen to be 16.2 GHz for the Ka-band and 8.1 GHz (16.2 GHz divided by two) for the Ku-band.

Figure 2A:
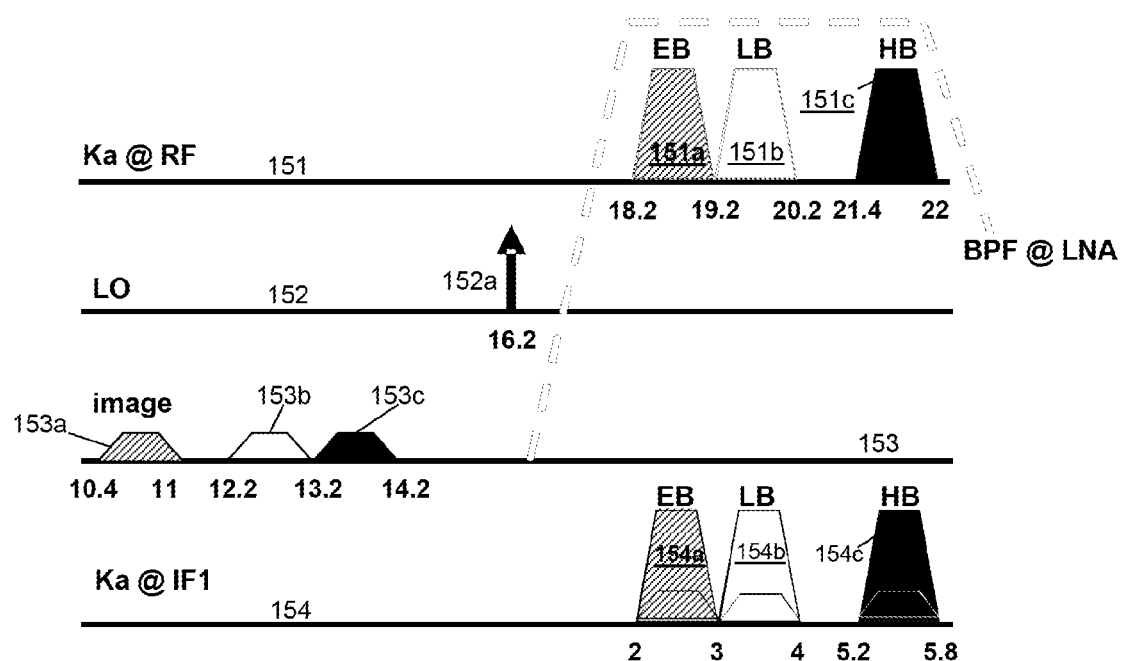
FIGS. 2a and 2b show the frequency distribution of image signals generated during down-conversion of the present invention.
Figure 3A:
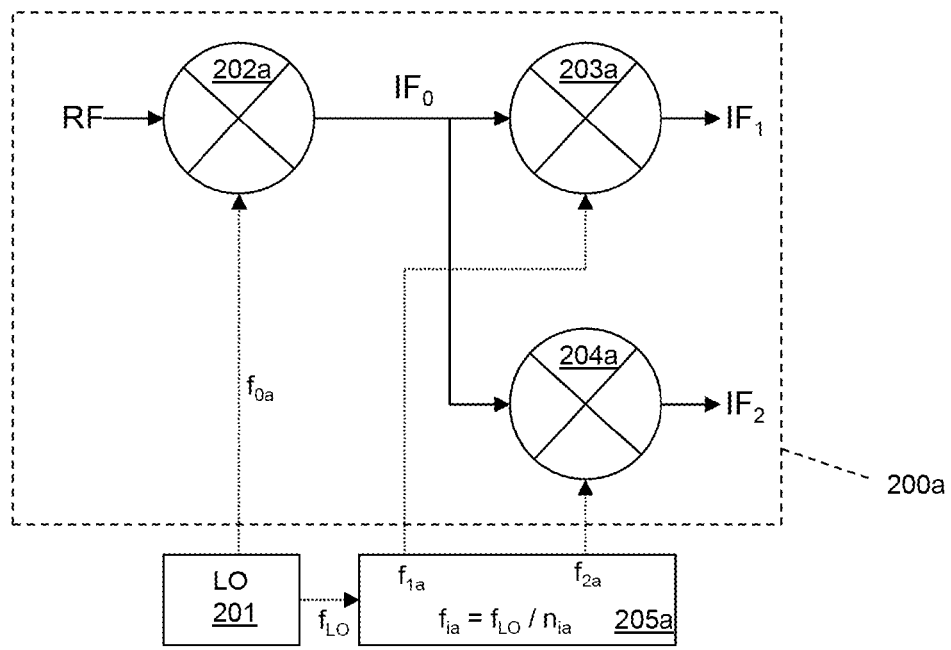
FIGS. 3a and 3b illustrate two embodiments of the present invention.
Figure 3B:
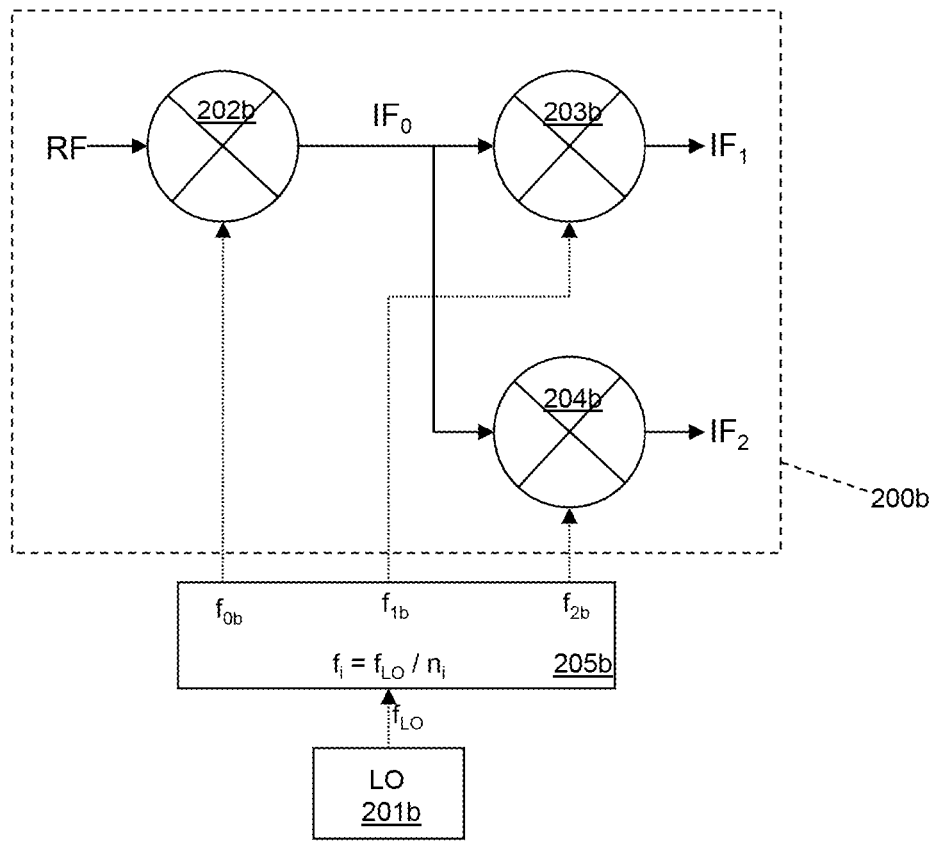

FIG. 2a illustrates the Ka-band down-conversion spectrum according to an embodiment of the invention. FIGS. 3a, 3b and 4 illustrate an embodiment of the invention for implementing the down-conversion spectrum of FIG. 2a.

FIG. 2a illustrates that a LO signal frequency 152a of 16.2 GHz (shown on the second line 152 of FIG. 2a) is used to down-convert the EB 151a, LB 151b and HB 151c of the Ka-band at frequencies in the range of 18.2-22 GHz. This down-conversion generates an IF1 band 154a-154c of 2-5.8 GHz (shown on the bottom line 154). Consequently, the image frequencies 153a-153c are between 10.4-14.2 GHz (shown on the third line 153).

An advantage of the heterodyne conversion becomes apparent from the illustration in FIG. 2a; the frequency spacing between the image frequencies 153a-153c and wanted frequencies 154a-154c is much larger than that achieved by direct conversion. The improvement in spacing between the image 153a-153c and desired frequencies 154a-154c makes filtering the image content easier to perform. For example, a simple band-pass filter, which may be implemented after a low noise amplifier (LNA), can perform this function and provide enough attenuation to make the single-side band noise almost equal to the double side-band noise, resulting in a low noise level for the down-converter.

The second step in this down-conversion process is to convert the obtained IF band (IF1) to a second IF band (IF2). The second IF band (IF2) corresponds to the L-band as illustrated in FIG. 2. The frequencies related to this down-conversion are not shown in FIG. 2a. The second step in this down-conversion process can be realized using local oscillator frequencies of 4.05 GHz (HB), 2.025 GHz (LB) and 1.0125 GHz (EB). These frequencies are integer related to 16.2 GHz which can be advantageous in terms of circuit implementation. In this example, integer division of the local oscillator frequency 152a with an even denominator is employed to obtain all of the required local oscillator frequencies for the Ka-band. The corresponding frequencies for this down-conversion scheme are provided in Table 1.

TABLE 1

Frequency planning Ka-band.

| Ka-band | RF (GHz) | IF1 (GHz) | IF2 (GHz) | Image (GHz) |
|---|---|---|---|---|
| EB | 18.2-19.2 | 2-3 | 0.9875-1.9875 | −0.975-0.025 |
| LB | 19.2-20.2 | 3-4 | 0.975-1.975 | 0.05-1.05 |
| HB | 21.4-22 | 5.2-5.8 | 1.15-1.75 | 2.3-2.9 |

Careful filtering at IFs can be used to prevent problems with images and spurious tones. It should also be noted that a band used in the United States of America, 17.2-18.2 GHz, is directly converted to 1-2 GHz by the LO signal frequency 152a of 16.2 GHz by this conversion scheme. This is advantageous as it also falls within the L-band.

Figure 2B:
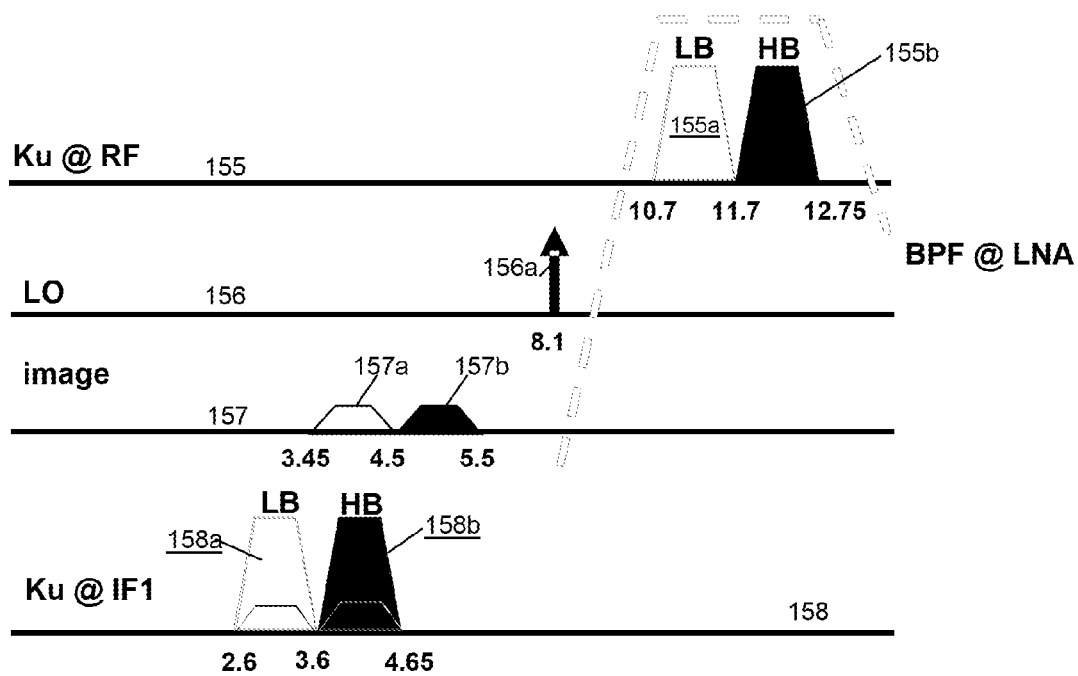

FIG. 2b illustrates Ku-band down-conversion according to an embodiment of the invention, which uses a similar technique to that of FIG. 2a. The down-conversion of FIG. 2b differs from FIG. 2a as a first conversion with a LO frequency 8.1 GHz is used. Once again, FIGS. 3a, 3b and 4 illustrate an example circuit for implementing the down-conversion of FIG. 2b.

FIG. 2b illustrates how a LO signal 156a with a frequency of 8.1 GHz (shown on the second line 156 of FIG. 2a) is used to down-convert the LB 155a and HB 155b of the Ku-band at frequencies of 10.7-12.85 GHz. This down-conversion generates an IF1 band 158a-158b of 2.6-4.65 GHz (shown on the bottom line 158). Consequently, the image frequencies 157a-157b are between 3.4-5.5 GHz (shown on the third line 157).

The second step in down-conversion involves mixing local oscillator frequencies of 2.7 GHz (for the HB), and 1.62 GHz (for the LB) with IF1 to acquire IF2. All the corresponding frequencies are provided in Table 2. Note that 2.7 GHz is equal to 8.1 GHz/3 and that 1.62 GHz is 8.1 GHz/5. That is, odd integer division of the local oscillator frequency 152a may be employed to obtain all of the required local oscillator frequencies for the Ku-band.

TABLE 2

Frequency planning Ku-band.

| Ku-band | RF (GHz) | IF1 (GHz) | IF2 (GHz) | Image (GHz) |
|---|---|---|---|---|
| LB | 10.7-11.7 | 2.6-3.6 | 0.98-1.98 | −0.36-0.64 |
| HB | 11.7-12.75 | 3.6-4.65 | 0.9-1.95 | 0.75-1.8 |

From Table 2 it can be seen that there is an issue with frequency band HB, as it is not entirely down-converted to the L-band (0.95-2.15 GHz). The lower limit of IF2 for the HB is 0.9 GHz in this example, whereas the lower limit of the L-band is 0.95 GHz. Therefore, a frequency range of 50 MHz of the HB falls outside the L-band.

The presently used standards do not allow systems to shift the split between LB and HB at RF. One of the options to prevent incorrect frequency mapping is to use a different frequency or to perform another shift of greater than 50 MHz. If an entirely different frequency plan for Ku-band down-conversion is to be used, then an option is to use a first LO at 9.1 GHz and IF tones of 0.65 GHz (LB, division by 14) and 1.51667 GHz (HB, division by 6). This results in an alternative frequency plan, as given in Table 3.

TABLE 3

Alternative frequency planning Ku-band.

| Ku-band | RF (GHz) | IF1 (GHz) | IF2 (GHz) | Image (GHz) |
|---|---|---|---|---|
| LB | 10.7-11.7 | 1.6-2.6 | 0.95-1.95 | −1.3-−0.3 |
| HB | 11.7-12.75 | 2.6-3.65 | 1.0833-2.1333 | −0.6167-0.4333 |

However, using this frequency plan requires two phase-locked loops (PLLs). Nonetheless, this may considered preferable to implementing a complex fractional divider in order to implement the frequency plans of Table 1 and Table 3 using a single PLL. The PLLs can be based on VCOs running at 16.2 GHz and 9.1 GHz. The frequency spacing in this example is such that even the $2^{nd}$ harmonic of 9.1 GHz (18.2 GHz) will not pull the VCO running at 16.2 GHz because of the distance in frequency, and non-integer relationship, between 18.2 GHz and 16.2 GHz.

FIGS. 3a and 3b illustrate two embodiments according to the present invention.

The embodiment of FIG. 3a comprises a local oscillator 201a, three mixers 202a-204a and a frequency divider 205a.

The arrangement of the mixers defines a 'heterodyne receive chain' 200a. Within the heterodyne receive chain 200a in FIG. 3a, the first stage mixer 202a mixes a received RF signal with a signal $f_{0a}$ fed directly from the local oscillator 201a. In this example, $f_{0a}$ is equal to a local oscillator frequency $f_{LO}$. The first stage mixer 202a provides a first intermediate frequency signal $IF_0$ as an output.

The frequency divider 205a also receives the local oscillator signal $f_{LO}$. The frequency divider 205a generates signals $f_{1a}$, $f_{2a}$ which are derived from the signal $f_{LO}$ from the local oscillator 201. The signals $f_{1a}$, $f_{2a}$ may be generated by the frequency divider using the formula $f_{ij}=f_{LO}/n_{ij}$, where j and i are dummy variables, and j=a, in this example. The value 'n' may belong to the set of positive integers. The signals $f_{0a}$, $f_{1a}$, $f_{2a}$ are each of a different frequency.

The first intermediate frequency signal $IF_0$ from the output of the first stage mixer 202a is provided as an input signal to two second stage mixers 203a, 204a. The second stage mixer 203a mixes the first intermediate frequency signal $IF_0$ with signal $f_{1a}$ from the frequency divider 205 in order to generate an output intermediate frequency signal $IF_1$. The second stage mixer 204a mixes the first intermediate frequency signal $IF_0$ with signal $f_{2a}$ from the frequency divider 205 in order to generate an output intermediate frequency signal $IF_2$.

FIG. 3b illustrates three mixers 202b-204b within a heterodyne receive chain 200b that are arranged in the same way as the mixers 202a-204c in FIG. 3a.

However, the arrangement of the local oscillator 201b and frequency divider 205b differs from the arrangement in FIG. 3a.

In FIG. 3b all of the signals $f_{0b}$, $f_{1b}$, $f_{2b}$ for the mixers 202b-204b are derived by the frequency divider 205b from the local oscillator signal $f_{LO}$. Such an arrangement can allow the frequency $f_{0b}$ to be set by the frequency divider 205 whilst maintaining a fixed relationship with the other signal frequencies $f_{1b}$, $f_{2b}$.

FIG. 4 demonstrates how an embodiment of the present invention may be used to simultaneously down-convert multiple channels in the Ka-band. This example comprises two symmetrical heterodyne receive chains 300a, 300b. One of the heterodyne receive chains 300a may be used to down-convert a horizontally polarised Ka-band (h-Ka) signal, the other receive chain 300b may be used to down-convert a vertically polarised Ka-band (v-Ka) signal. Each heterodyne receive chain 300a, 300b comprises a first stage mixer 302a, 302b and, in this example, three second stage mixers 303a, 304a, 306a, 303b, 304b, 306b. Although not shown in FIG. 4, it will be appreciated that a local oscillator signal at 16.2 GHz is provided to the frequency divider 305.

FIG. 5a illustrates further details of the heterodyne receive chain 300a of FIG. 4 that is used to down-convert the horizontal polarised Ka-band.

The embodiment of FIG. 5a uses the concept of heterodyne mixing to produce a first IF signal (IF1) between 2 GHz and 5.8 GHz using a LO signal frequency of 16.2 GHz. The first stage of the down-conversion process is achieved by a first stage mixer 402, which receives a Ka-band radio frequency (RF) signal (18.20-22.00 GHz) via an amplifier 407a and a band pass filter 407b. The amplifier 407a and filter 407b may provide selected frequency sensitivity in the Ka-band. The filter 407b may be necessary to select the desired RF band out of a broader range of frequencies in a received RF signal.

The first stage mixer 402 mixes the RF signal with a 16.2 GHz local oscillator signal provided by a frequency divider 405. It will be appreciated that in some examples the 16.2 GHz signal may be a local oscillator signal without frequency division. The output of the first stage mixer 402 contains a first intermediate frequency signal with a bandwidth of 2-5.8 GHz. The first intermediate frequency signal is fed to a number of second stage mixers 403, 404, 406, each second stage mixer belongs to a different branch for second stage down-conversion processing and provides a second intermediate frequency. The example shown in FIG. 5a has three branches, one for each of the high (HB), low (LB) and extra (EB) bands.

The HB second stage mixer 403, which is configured to output the high band (HB) signal, receives the first intermediate frequency signal from the first stage mixer 402 via a filter 408. The filter 408 is a band pass filter with a pass band of 5.2-5.8 GHz. The HB second stage mixer 403 mixes the filtered first intermediate frequency signal with a 4.05 GHz (LO/4) signal provided by the frequency divider 405. The output of the HB second stage mixer 403 is a second intermediate frequency signal, also referred to as an output intermediate frequency signal, with a bandwidth of 1.15-1.75 GHz. The output intermediate frequency signal is further filtered in this example by a band pass filter 410. The band pass filter 410 has the same nominal bandwidth as the output intermediate frequency signal and may provide further frequency selectivity, in some embodiments.

The LB second stage mixer 404, which is configured to output the low band (LB) signal, receives the first intermediate frequency signal from the first stage mixer 402 via a filter 409. The filter 409 is a band pass filter with a pass band of 3-4 GHz. The LB second stage mixer 404 mixes the filtered first intermediate frequency signal with a 2.025 GHz (LO/8) signal provided by the frequency divider 405. The output of the LB second stage mixer 404 contains an output intermediate frequency signal with a bandwidth of 0.975-1.975 GHz. The output intermediate frequency signal is further filtered in this example by a band pass filter 411. The band pass filter 411 has the same nominal bandwidth as the output intermediate frequency signal and may provide further frequency selectivity, in some embodiments.

The EB second stage mixer 406, which is configured to output the extra band (EB) signal, receives the first intermediate frequency signal directly from the output of the first stage mixer 402, in this example. Alternatively, a filter could be implemented between the output of the first stage mixer 402 and an input of the EB second stage mixer 406. The filter would, in this case, have a pass band of 2-3 GHz. The EB second stage mixer 406 mixes the filtered first intermediate frequency signal with a 1.0125 GHz (LO/16) signal provided by the frequency divider 405. The output of the EB second stage mixer 406 contains output intermediate frequency signals with a bandwidth of 0.9875-1.975 GHz. The output intermediate frequency signal is further filtered in this example by a band pass filter 412. The band pass filter 412 has a pass band of 0.9875-1.975 GHz.

FIG. 5b illustrates schematically a circuit that can perform a similar down-conversion process to that of the circuit of FIG. 5a. In this example, a filter 453 is positioned between the output of the first stage mixer 442 and an input of the second stage mixer 446. Second stage mixer 446 relates to the EB second stage mixer 406 in FIG. 5a. The filter 453 has a pass-band of 2-3 GHz.

FIG. 5c shows an alternative embodiment of the invention, suitable for use as a Ku-band down-converter. A heterodyne receive chain 420 in this embodiment comprises a first stage mixer 422 and two second stage mixers 423, 424.

The first stage mixer 422 receives an RF input at a frequency of 10.7-12.75 GHz via an amplifier 427a and a filter 427b. The amplifier 427a and filter 427b components have similar functions to their equivalents, amplifier 407a and filter 407b, described above with regard to FIG. 5a. The filter 407b can be used to achieve low noise numbers (for example, single side-band can become double side-band) by filtering out images at 3-5.5 GHz that occur when processing the 10.75 GHz-12.75 Ghz RF band with a 8.1 GHz LO. These image frequencies are shown in FIG. 2b.

The first stage mixer 422 also receives a local oscillator signal at 8.1 GHz from frequency divider 425. The first stage mixer 422 provides a first intermediate frequency signal within the band 2.6-4.65 GHz.

A first branch of the heterodyne receive chain 420 comprises an HB second stage mixer 423 and a filter 428. The filter 428 is coupled between an output of the first stage mixer 422 and an input of the second stage mixer 423. The filter 428 is a band pass filter with a pass band of 3.6-4.65 GHz. The HB second stage mixer 423 also receives a 2.65 GHz (suitable for the high band Ku-band signal) local oscillator signal input from the frequency divider 425. The HB second stage mixer 423 produces an output intermediate frequency signal with a frequency of 0.95-2 GHz.

A second branch of the heterodyne receive chain 420 comprises a LB second stage mixer 424 and a filter 429. The filter 429 is coupled between an output of the first stage mixer 422 and an input of the LB second stage mixer 424. The filter 429 is a band pass filter with a pass band of 2.6-3.6 GHz. The second stage mixer 424 also receives a 1.62 GHz (suitable for the low Ku-band signal) local oscillator signal input from the frequency divider 425. The second LB stage mixer 424 produces an output intermediate frequency signal with a frequency of 0.98-1.98 GHz.

Therefore, it can be seen from each of FIGS. 5a to 5c that an embodiment of the invention can be used to down-convert the Ka- and Ku-bands in a received RF signal to the intermediate frequencies within the L-band using local oscillator signals that are derived, by integer division, from a single local oscillator signal. This can be advantageous over the prior art as only a single oscillator is required and the interference between oscillating signals is reduced when compared with the prior art.

FIG. 6 shows an embodiment in which poly-phase filtering is utilised. The arrangement of various mixers and downconverters shown in this example is similar to that described previously with regard to FIG. 5, and will not be discussed further except where differences exist between the two examples.

The technique of poly-phase filtering, which is known in the art, can be used when it is possible to generate quadrature local oscillator signals at both the operating RF and IF. Poly-phase filtering allows more selective filtering (including discrimination between positive and negative frequencies).

Embodiments employing poly-phase filtering allow the removal of the RF filter that is present before the first stage mixer in FIG. 5a. Instead, a poly-phase filter (PPF) 501 is used after the first stage mixer 502. Providing a filter at IF, rather than at RF, can simplify the design requirements of the filter. For example, the Q factor for the PPF 501 in FIG. 6 is 1, compared with a Q factor of 5.3 for the filter 407b operating on the RF signal in FIG. 5a. PPF 501 operates on a first intermediate frequency signal. The PPF 501 can be used to overcome imperfections due to IQ imbalance at a frequency of a local oscillator (LO) and spurious responses around higher LO harmonics. The PPF 501 may be omitted in some embodiments.

A combination of a single phase system and a poly-phase system is also possible in some embodiments. For example, a single phase first stage mixer (such as that shown in FIG. 4) can be used in combination with intermediate frequency poly-phase processing (such as that shown in FIG. 6). Alternatively, the first stage mixer 501 of FIG. 6 can be used with the second stage mixers 403, 404, 406 of FIG. 5a. This allows the combination of poly-phase filtering at IF using IQ LO signals at IF with a single-phase LO signal at RF.

FIG. 7 illustrates a circuit diagram demonstrating the arrangement of a frequency divider 600 suitable for use in the present invention. Frequency divider 600 comprises a phaselocked loop (PPL) architecture which maintains fixed output frequencies for supply to the first and second stage mixers of a down-converter.

A voltage controlled oscillator (VCO) 601 can operate at a fixed frequency of 16.2 GHz. As discussed above, this output frequency is suitable for use by a first stage mixer for the Ka-band in one example.

Four frequency divider blocks 602-605 with a division ratio of 2 are provided in series in this embodiment of the frequency divider 600. A first frequency divider block 602 receives the local oscillator signal frequency directly from VCO 601 and provides an 8.1 GHz frequency output signal suitable for a first stage mixer operating in the Ku-band. A second frequency divider block 603 receives the signal output by the first frequency divider block 602 and provides a 4.05 GHz output signal for a second stage mixer operating in the Ku-band (HB). A third frequency divider block 604 receives the signal output by the second frequency divider block 603 and provides a 2.025 GHz output signal for a second stage mixer operating in the Ka-band (LB). A fourth frequency divider block 605 receives the signal output by the third frequency divider block 604 and provides a 1.0125 GHz signal for a second stage mixer operating in the Ka-band (EB).

An additional frequency divider block 606 with a division ratio of 81 is provided in this example. The additional frequency divider block 606 receives the signal output by the second frequency divider block 603 and outputs a 50 MHz signal. The additional frequency divider 606 can be implemented with 6 cascaded ⅔-divider cells with a fixed division-by-2 or division-by-3 operation.

An output of the additional frequency divider block 606 may be provided to a phase frequency detector (PFD) 607. The PFD 607 also receives a fixed frequency input signal of 50 MHz from a frequency doubler 608 which receives a reference frequency of 25 MHz from a crystal oscillator (not shown). The output of the PFD 607 is provided to a charge pump and discrete components 609, which behave in their conventional manner within a phase locked loop (PPL) arrangement. It will be appreciated that the component values shown in FIG. 7 are examples only, and that other component values could be used. The PPL has the effect of maintaining the correct output frequency of the VCO 601 and therefore the output frequency of the frequency divider blocks 602-605.

It will be appreciated that the frequency bands and plans disclosed herein are purely for illustrative purposes and are not intended to be a limitation on the application of the invention.

An advantage of embodiments of the present invention is that a requirement for multiple local oscillators within a multi-band down-converter can be removed. A further advantage is that intra-mixer interference caused by the presence of multiple local oscillator signals may be reduced. Another advantage of embodiments of the present invention is that a multi-band down-converter may be implemented on a single integrated circuit, rather than as a plurality of discrete components.

It will be appreciated that any components that are described herein as being coupled or connected could be directly or indirectly coupled or connected. That is, one or more components could be located between two components that are said to be coupled or connected whilst still enabling the required functionality to be achieved.

The invention claimed is:

1. A down-converter for receiving a multiband radio frequency signal and a local oscillator signal generated by a single oscillator, the down-converter comprising:
 a frequency divider configured to divide the local oscillator signal and provide a plurality of different divided local oscillator signals; and
 two heterodyne receive chains configured to receive the same plurality of different divided local oscillator signals derived from the single oscillator for down-converting the multiband radio frequency signal, wherein each heterodyne receive chain is configured to receive the multiband radio frequency signal with different polarizations, each heterodyne receive chain comprising:
   a first stage mixer configured to mix the multiband radio frequency signal and a first divided local oscillator signal of the plurality of different divided local oscillator signals in order to generate a first intermediate frequency signal, and
   a plurality of second stage mixers, each second stage mixer configured to mix the first intermediate signal and a second divided local oscillator signal of the plurality of different divided local oscillator signals in order to generate second intermediate frequency signals that each represent a different band from the multiband radio frequency signal;
 where the frequency divider is configured to provide a different divided local oscillator signal to each of the second stage mixers, and where each of the different divided local oscillator signals provided to the second stage mixers are of a different frequency.

2. The down-converter of claim 1, wherein each of the second intermediate frequency signals comprise frequencies within the L-band.

3. The down-converter of claim 1, wherein the frequency of the local oscillator signal is an integer multiple of the frequency of each divided local oscillator signal.

4. The down-converter of claim 1, wherein the frequency of the local oscillator signal is equal to each divided local oscillator signal frequency multiplied by two to the power of an integer.

5. The down-converter of claim 1, further comprising one or more filters coupled between the first stage mixer and one or more of the second stage mixers, the one or more filters configured to block signals with a frequency that does not correspond to the band of the first intermediate frequency signal.

6. The down-converter of claim 5, wherein the filter is a poly phase filter.

7. The down-converter of claim 1, further comprising a filter coupled between an input of the radio circuit for receiving the radio frequency signal and an input of the first stage mixer configured to receive the radio frequency signal, the filter configured to block signals with a frequency that does not correspond to the bands of the radio frequency signal.

8. The down-converter of claim 1, further comprising one or more filters configured to filter one or more of the second intermediate frequency output signals in order to block signals with a frequency that does not correspond to the band of the associated second intermediate frequency signal.

9. The down-converter of claim 1, further comprising an amplifier configured to amplify the radio frequency signal and provide it to the first stage mixer.

10. The down-converter of claim 1, wherein the local oscillator signal frequency is a fixed frequency signal.

11. The down-converter of claim 1, wherein each divided local oscillator signal is of a fixed frequency.

12. A radio circuit comprising the down-converter of claim 1 and a local oscillator signal generator.

13. A method for down-converting a radio frequency signal into a plurality of intermediate frequency signals, the method comprising:
 receiving a multiband radio frequency signal and a local oscillator signal generated by a single oscillator; and
 receiving the same plurality of different divided local oscillator signals derived from the single oscillator at two heterodyne receive chains for down-converting the multiband radio frequency signal and receiving the multiband radio frequency signal with different polarizations at each heterodyne receive chain, comprising:
   mixing a signal derived from the radio frequency signal with a divided local oscillator signal derived from the local oscillator signal in order to obtain a first intermediate frequency signal without an additional frequency multiplier;
   dividing the frequency of a signal derived from the local oscillator signal by a first factor in order to obtain a first divided local oscillator signal;
   mixing a signal derived from the radio frequency signal with a divided local oscillator signal derived from the local oscillator signal in order to obtain a first intermediate frequency signal without an additional frequency multiplier;
   dividing the frequency of a signal derived from the local oscillator signal by a second factor in order to obtain a second divided local oscillator signal, wherein the second factor is different to the first factor; and mixing the first intermediate frequency signal with the second divided local oscillator signal in order to obtain a second output intermediate frequency signal, wherein the first and second output intermediate frequency signals represent bands from the multiband radio frequency signal.

* * * * *